United States Patent
Lokshin et al.

(10) Patent No.: US 6,691,031 B2
(45) Date of Patent: Feb. 10, 2004

(54) METHOD AND APPARATUS FOR SUBSTITUTING SENSOR DATA FOR SATELLITE SIGNAL IN GPS RECEIVER

(75) Inventors: Anatole M. Lokshin, Claremont, CA (US); Viktor Kulik, Claremont, CA (US); John M. Efseaff, Pomona, CA (US)

(73) Assignee: Magellan Corporation, Santa Clara, CA (US)

( * ) Notice: Subject to any disclaimer, the term of this patent is extended or adjusted under 35 U.S.C. 154(b) by 0 days.

(21) Appl. No.: 10/158,973

(22) Filed: May 31, 2002

(65) Prior Publication Data

US 2003/0225514 A1 Dec. 4, 2003

(51) Int. Cl.[7] ................................................. G06F 7/00
(52) U.S. Cl. ........................... 701/213; 342/83; 342/98; 342/100
(58) Field of Search ....................... 701/213; 73/178 R; 342/83, 98, 100

(56) References Cited

U.S. PATENT DOCUMENTS

| | | | | | |
|---|---|---|---|---|---|
| 5,408,239 A | * | 4/1995 | Endo | .......................... | 342/352 |
| 5,629,649 A | * | 5/1997 | Ujiie | ........................... | 331/17 |
| 5,654,718 A | * | 8/1997 | Beason et al. | ........ | 342/357.15 |
| 5,717,402 A | * | 2/1998 | Chu | ....................... | 342/357.12 |
| 6,078,224 A | * | 6/2000 | Ujiie | ........................... | 331/10 |
| 6,452,961 B1 | * | 9/2002 | Van Wechel | ................ | 375/142 |
| 6,466,958 B1 | * | 10/2002 | Van Wechel et al. | ....... | 708/422 |

\* cited by examiner

Primary Examiner—William A. Cuchlinski, Jr.
Assistant Examiner—Olga Hernandez
(74) Attorney, Agent, or Firm—Lowe Hauptman Gilman & Berner, LLP

(57) ABSTRACT

Embodiments of the present invention are directed to a method and apparatus for substituting temperature sensor data for a satellite signal in a GPS receiver. In one embodiment of the present invention, a mathematical model of a GPS receiver's clock's response to temperature change is maintained. In one embodiment, the mathematical model is a third order polynomial. In one embodiment, when a GPS receiver has contact with at least four GPS satellites, the receiver collects data on changes in temperature and resulting changes in the GPS receiver's clock frequency. The data is incorporated into the GPS receiver's mathematical model. In one embodiment, the data is incorporated by modifying one or more coefficients in the mathematical model. In one embodiment, if a GPS receiver only has contact with three GPS satellites, changes in temperature and the mathematical model are used to estimate an adjustment to the signal generated by the clock.

33 Claims, 6 Drawing Sheets

METHOD AND APPARATUS FOR SUBSTITUTING SENSOR DATA FOR SATELLITE SIGNAL IN GPS RECEIVER

BACKGROUND OF THE INVENTION

1. Field of the Invention

The present invention relates to the field of global positioning satellite systems, and in particular to a method and apparatus for substituting sensor data for a satellite signal in a GPS receiver.

2. Background Art

In a typical global positioning system (GPS), a receiver monitors signals from a plurality of GPS satellites to determine position, speed or other information about the receiver. The GPS receiver must receive a signal from four GPS satellites to determine the receiver's longitude, latitude and altitude as well as an adjustment to a signal generated from the receiver's clock. Since a GPS receiver must be in direct line of site with a GPS satellite to receive a signal from the satellite, a problem arises when, in some instances (e.g., travel through a canyon or between large buildings), a GPS receiver loses direct line of site contact with a GPS satellite. Prior art methods of compensating for the loss of a GPS satellite signal are inefficient. This problem can be better understood with a review of GPS systems.

GPS Systems

A global positioning system now provides a worldwide, 24 hours, location service. The system includes multiple GPS satellites to broadcast location signals, control stations to monitor and control the satellites, and GPS receivers to receive the signals. Commercial Global Positioning System (GPS) receivers now are used to provide accurate location information in many navigation, tracking, and timing applications. A GPS antenna that is a part of a GPS receiver must have a line of sight to a GPS satellite to receive the GPS signal from that satellite.

GPS location is based on one-way ranging from the GPS satellites to the GPS receiver antenna. Ranges are measured to all satellites simultaneously in view by matching (correlating) the frequency and the time of arrival (TOA) of the incoming GPS signal to a receiver-generated replica signal. With four ranges (i.e., four known parameters), the receiver can determine four unknowns, typically latitude, longitude, altitude, and a clock adjustment to the replica. The ranges are termed "pseudo-ranges" because the actual distances to the GPS satellite are not known until the internal replica has been adjusted. Time of day is computed from the adjustment to the TOA of the replica.

The clock adjustment must be calculated because, among other reasons, the frequency of a clock used in a GPS receiver typically changes slightly during normal use due to such factors as changes in temperature of the crystal oscillator used in the clock. Temperature changes in the crystal oscillator result from the normal electronic operation of the receiver as well as environmental factors outside of the GPS receiver (e.g., the receiver traveling from a sunny area to a shady area). Even when the average temperature of a crystal oscillator is not changing over time, the temperature drifts above or below the average temperature enough to affect the performance of the crystal oscillator. Thus, failing to adjust the signal generated from the clock could result in erroneous position calculations.

Each GPS satellite broadcasts its position in a signal having a carrier frequency at approximately 1.575 GHz. The signal is modulated by a PRN code sequence of 1023 chips, repeating (transmitted) at a 1 millisecond interval, where each satellite uses a different PRN code sequence. The use of the different PRN sequences enables a GPS receiver to distinguish the GPS signals from different GPS satellites. The frequency of the signal received from each GPS satellite will have a Doppler shift due to the relative velocity between the GPS satellite and a GPS receiver antenna. A velocity for the GPS receiver antenna may be determined from the rate of change of the location or from the rate of change of the pseudo-ranges after accounting for the Doppler shift due to the motion of the satellite.

Loss of Satellite Signals

During normal use, some GPS receivers will only receive a signal from fewer than four GPS satellites. As a result, the GPS receiver cannot calculate an exact value for longitude, latitude, altitude and receiver clock adjustment. Some prior art GPS receivers compensate for having fewer than four GPS satellite signals by waiting until at least four GPS satellite signals are present to calculate values for longitude, latitude, altitude, and signal adjustment. This means that the user of a GPS system will not receive data for longitude, latitude, altitude, and signal adjustment until the GPS receiver establishes contact with a sufficient number of GPS satellites.

One prior art GPS receiver maintains a table of its clock frequency at different operating temperatures (at every degree Celsius) while in contact with at least four GPS satellites sufficient to compute full GPS solution. The receiver then uses a measure of the temperature and the table to estimate the frequency of the crystal oscillator in its clock, and uses the estimated frequency to control which frequencies it scans in order to speed up GPS satellite signal acquisition on power up or re-establish contact with a lost GPS satellite signal.

Other prior art GPS receivers make the assumption that altitude remains constant between the moment the number of GPS satellites with which the receiver has contact drops below four and the moment the GPS receiver establishes contact with four GPS satellites again. With this assumption, the GPS receiver uses three ranges (i.e., three known parameters) to determine the remaining three unknowns, longitude, latitude and adjustment to signal. However, if the number of ranges available to the receiver is two or fewer, this method is not able to calculate longitude, latitude or adjustment data. Additionally, if altitude is changing significantly, this prior art method fails to provide sufficient calculations of longitude, latitude and adjustment data.

Other prior art GPS receivers designed for the car navigation make the assumption that the direction of motion remains constant between the moment the number of GPS satellites with which the receiver has contact drops below four and the moment the GPS receiver establishes contact with four GPS satellites again. With this assumption, the GPS receiver uses three ranges (i.e., three known parameters) to determine the remaining three unknowns, longitude, latitude and adjustment to signal. However, such an assumption is not always true even for the car navigation, let alone other GPS applications.

Calculating Unknowns

A conventional equation used to derive position from GPS signals is expressed by the following matrix equation:

$$r-d=H*(x-x_o)+c*1+e \qquad (1)$$

In Equation (1), r denotes pseudo-range measurements for all GPS satellites, x is the true and unknown receiver position, $x_o$ is the assumed position of the receiver, d is a vector of the distances from the point $x_o$ to the GPS satellites, H is a matrix of the satellite directional vectors, c is the unit clock error times speed of light and vector e represents measurement noise.

Usually, x is a three-dimensional vector (i.e., latitude, longitude and altitude), so Equation (1) has 4 unknowns (i.e., latitude, longitude, altitude and c), and is resolvable if vectors r and d have dimension of 4 or more. By using various techniques, Equation (1) is resolved to determine the required correction, dx, such that $$x = x_o + dx \qquad (2)$$

In many cases, the altitude is known. In such cases, Equation (1) has only three unknowns (i.e., latitude, longitude and c), and is resolvable using signals from only three GPS satellites.

Equation (1) represents the relationship between receiver's position, receiver clock error and observed pseudo-ranges. A similar relationship is derivable between the observed signal Doppler, local oscillator frequency drift and the receiver's velocity:

$$D = H*(v - v_s) + f*1 + e \qquad (3)$$

In Equation (3), D is a vector of the observed Doppler signals, H is the same directional matrix as in Equation (1), v is an unknown vector of the receiver's ground velocity, $v_s$ is computed satellite velocity, and f is a frequency error of the local oscillator times speed of light. As in Equation (1), e denotes measurement noise.

SUMMARY OF THE INVENTION

Embodiments of the present invention are directed to a method and apparatus for substituting sensor data for a satellite signal in a GPS receiver. In one embodiment, a change in sensor data is used to substitute sensor data for a lost satellite signal. In one embodiment, the sensor data is temperature data.

In one embodiment of the present invention, a mathematical model of a GPS receiver's clock's response to temperature change is maintained. In one embodiment, the mathematical model is a third order polynomial.

In one embodiment, when a GPS receiver has contact with at least four GPS satellites, the receiver collects data on changes in temperature and resulting changes in the GPS receiver's clock frequency. In one embodiment, temperature data is collected approximately every hundred milliseconds. The data is incorporated into the GPS receiver's mathematical model. In one embodiment, the data is incorporated by modifying one or more coefficients in the mathematical model.

In one embodiment, if a GPS receiver only has contact with three GPS satellites, changes in temperature and last determined value of the receiver oscillator frequency, and the mathematical model are used to estimate an adjustment to the current value of the receiver oscillator frequency. The estimate is used with the three ranges (three known parameters) to calculate the remaining three unknowns, longitude, latitude and altitude.

In another embodiment, if a GPS receiver only has contact with two GPS satellites, changes in temperature and last determined value of the receiver oscillator frequency, and the mathematical model are used to estimate an adjustment to the current value of the receiver oscillator frequency. Additionally, the altitude is estimated. In one embodiment, the altitude is estimated by assuming it remains unchanged from when it was last calculated from the full GPS solution. In another embodiment, the change in altitude is estimated using pressure sensor data. The adjustment and altitude estimates are used with the two ranges (two known parameters) to calculate the remaining two unknowns, longitude and latitude.

BRIEF DESCRIPTION OF THE DRAWINGS

These and other features, aspects and advantages of the present invention will become better understood with regard to the following description, appended claims and accompanying drawings where:

DETAILED DESCRIPTION OF THE INVENTION

Figure 1:
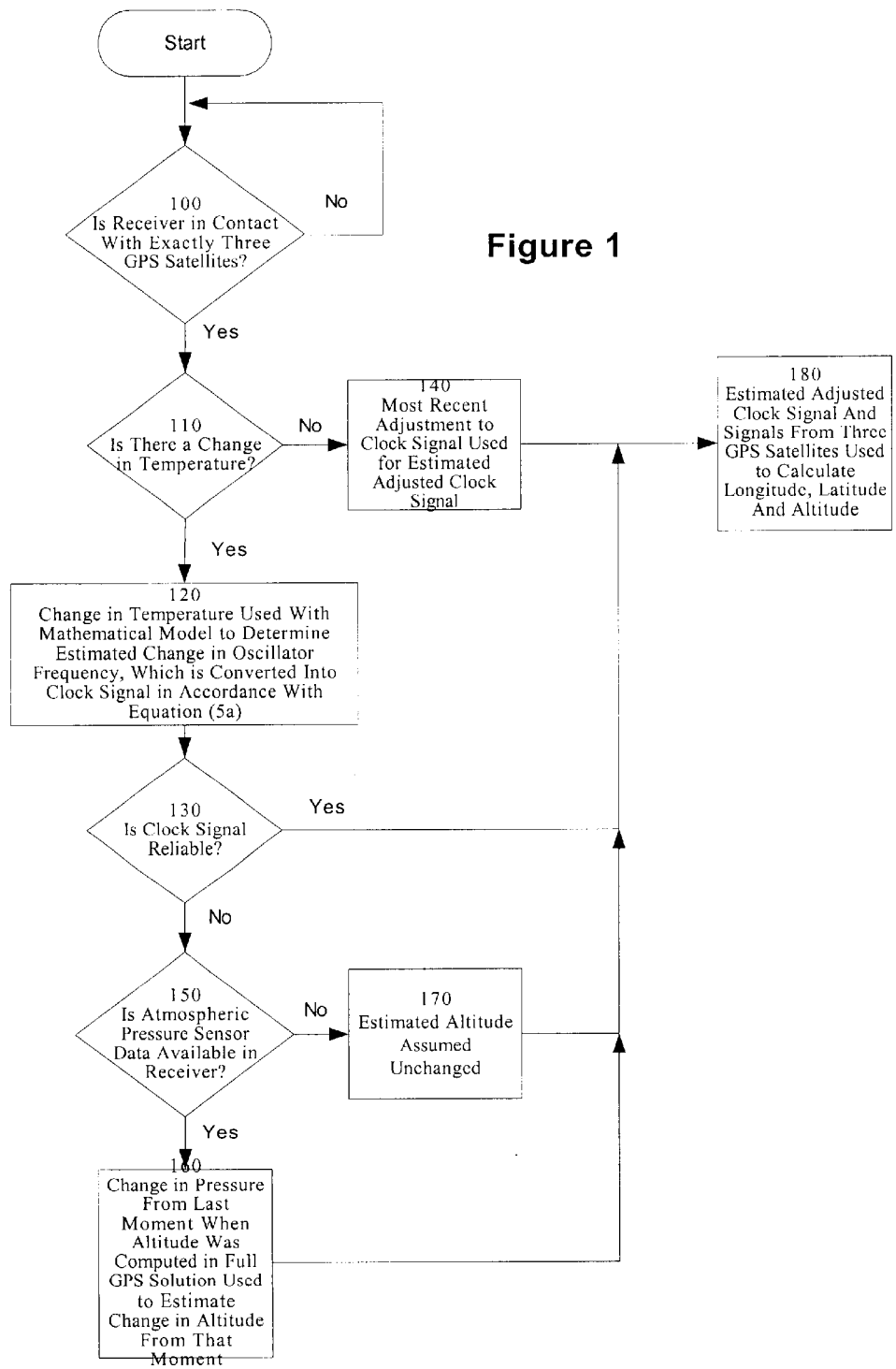
FIG. 1 is a flow diagram of the process of calculating an adjusted clock signal, longitude, latitude and altitude with only three GPS satellite signals in accordance with one embodiment of the present invention.

The invention is a method and apparatus for substituting sensor data for a satellite signal in a GPS receiver. In the following description, numerous specific details are set forth to provide a more thorough description of embodiments of the invention. It is apparent, however, to one skilled in the art, that the invention may be practiced without these specific details. In other instances, well known features have not been described in detail so as not to obscure the invention.

Sensor Change Substitutions

In one embodiment, a change in sensor data is used to substitute sensor data for a lost satellite signal. The receiver has a means for converting the observed change in the sensor data into an estimate of one of the four fundamental GPS unknowns.

In one embodiment, the sensor data is temperature data. In another embodiment, the sensor data is pressure data. In various other embodiments, other types of sensor data are used.

Sub-Optimal Calculations

Equation (3) has the same number of unknowns as Equation (1), so it is resolvable with 4 or 3 satellite signals depending on whether altitude is assumed to be a constant.

In one embodiment, the oscillator frequency error is determined from the information that is not covered by Equation (3). Thus, the number of unknowns is being reduced by one and the unknown velocity v is derivable using signals from one fewer GPS satellites.

$$D - f*1 = H*(v - v_s) + e \quad (4)$$

If Equation (4) is resolved, the receiver position is determinable using one fewer GPS satellites by integrating the velocity obtained from Equation (4):

$$x(t+n*dt) = x(t) + 0.5 * \text{sum}\{(v(t_k) + v(t_{k+1})) * (t(k+1) - t(k))\}; k = 0, \ldots, n-1 \quad (5)$$

Other embodiments use other similar expressions. In one embodiment, very accurate velocity determination is important for accurate position determination because any error in velocity will quickly integrate into a large position error.

In another embodiment, oscillator drift, f, is integrated into accumulated clock error, dC:

$$C(t_n) = C(t) + 0.5 * \text{sum}\{(f(t_k) + f(t_{k+1})) * (t(k+1) - t(k))\}; k = 0, \ldots, n-1 \quad (5a)$$

In this embodiment, position, x, at the time, $t_n$, is found from a modification of Equation (1):

$$r - d - C*1 = H*(x - x_o) + e \quad (4a)$$

In other embodiments, a combination of (4) and (4a) is used.

Temperature Effect on Crystal Oscillator

The natural frequency of a crystal oscillator depends on its temperature T.

$$f = F(T) \quad (6)$$

Therefore, in one embodiment, if the function F(T) is known, the number of required GPS satellites is reduced by computing velocity from the Equation (7), a modification of the Equation (4) using formula (6):

$$D - F(T)*1 = H*(v - v_s) + e \quad (7)$$

Three Satellite Performance

In one embodiment, if a GPS receiver only has contact with three GPS satellites, changes in temperature and a mathematical model are used to estimate an adjustment to the signal generated by the clock. The estimate is used with the three ranges (three known parameters) to calculate the remaining three unknowns, longitude, latitude and altitude.

FIG. 1 illustrates the process of calculating an adjusted clock signal, longitude, latitude and altitude with only three GPS satellite signals in accordance with one embodiment of the present invention. At block 100, it is determined whether the receiver is in contact with exactly three GPS satellites. If the receiver is not in contact with exactly three GPS satellites, the process repeats at block 100. If the receiver is in contact with exactly three satellites, at block 110, it is determined whether there is a change in temperature. If there is no change in temperature, at block 140, the most recent adjustment to the clock signal is used for the estimated adjusted clock signal, and the process continues at block 180.

If there is a change in temperature, at block 120, the change in temperature is used with the mathematical model to determine an estimated change in oscillator frequency, which is converted into clock signal in accordance with the equation (5a). At block 130, it is determined whether the clock signal is reliable. If the clock signal is reliable, the process continues at block 180. If the clock signal is not reliable, at block 150, it is determined whether atmospheric pressure sensor data is available in the receiver. If the pressure data are available, the change in the pressure from the last moment when the altitude was computed in full GPS solution is used to estimate the change in altitude from that moment at block 160 and the process continues at block 180. If the pressure data are not available, estimated altitude is assumed unchanged at block 170 and the process continues at block 180. At block 180, the estimated adjusted clock signal or the estimated from pressure sensor data altitude, and signals from the three GPS satellites are used to calculate longitude, latitude and altitude.

Two Satellite Performance

In another embodiment, if a GPS receiver only has contact with two GPS satellites, changes in temperature and the mathematical model are used to estimate an adjustment to the signal generated by the clock. Additionally, the altitude is estimated. In one embodiment, the altitude is estimated by assuming it remains unchanged from when it was last calculated. In another embodiment, the change in altitude is estimated using pressure sensor data. The adjustment and altitude estimates are used with the two ranges (two known parameters) to calculate the remaining two unknowns, longitude and latitude.

Figure 2:
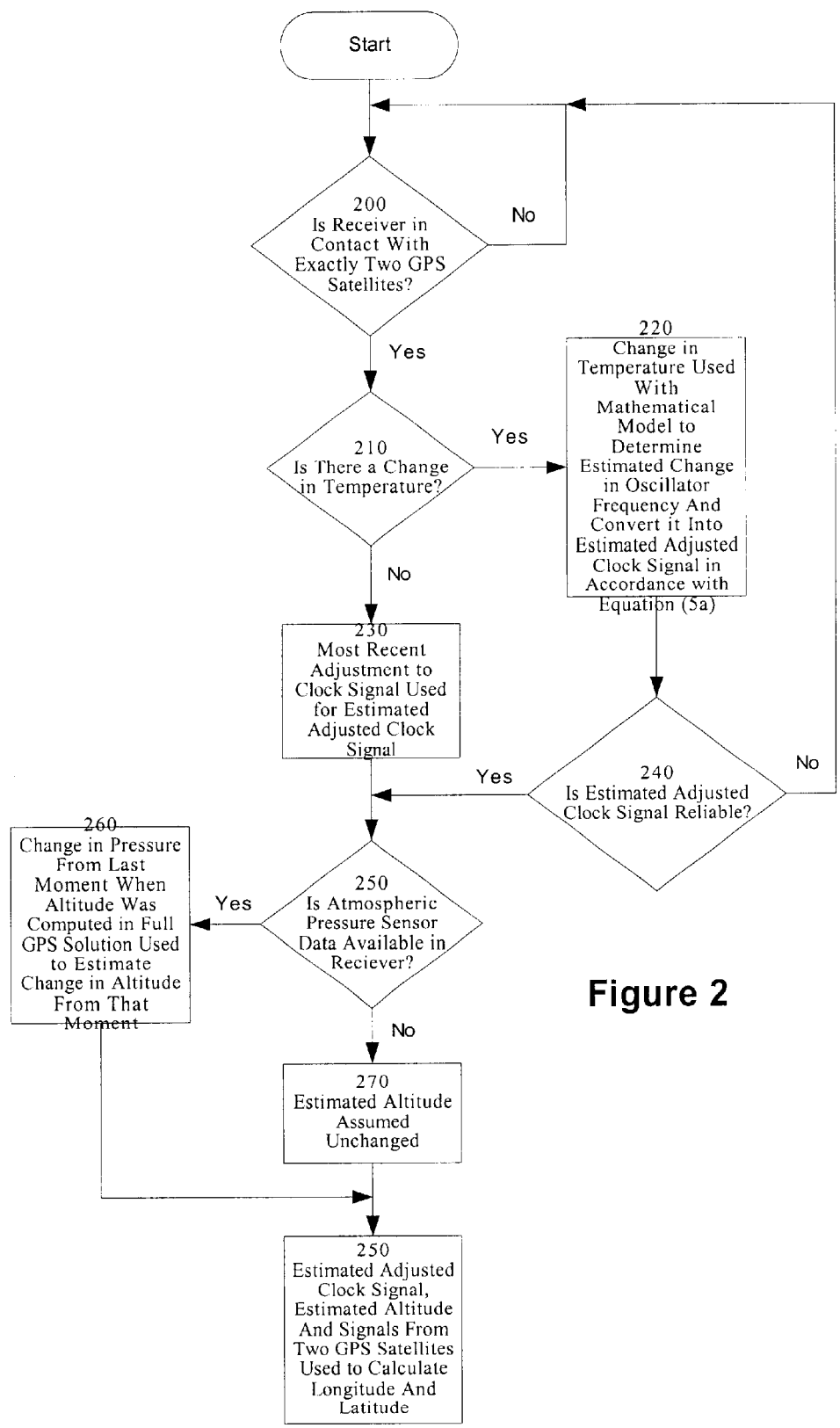
FIG. 2 is a flow diagram of the process of calculating an adjusted clock signal, longitude, latitude and altitude with only two GPS satellite signals in accordance with one embodiment of the present invention.

FIG. 2 illustrates the process of calculating an adjusted clock signal, longitude, latitude and altitude with only two GPS satellite signals in accordance with one embodiment of the present invention. At block 200, it is determined whether the receiver is in contact with exactly two GPS satellites. If the receiver is not in contact with exactly two GPS satellites, the process repeats at block 200. If the receiver is in contact with exactly two satellites, at block 210, it is determined whether there is a change in temperature.

If there is a change in temperature, at block 220, the change in temperature is used with the mathematical model to determine an estimated change in oscillator frequency, and convert it into an estimated adjusted clock signal in accordance with the equation (5a). At a block 240, it is determined whether the estimated adjusted clock signal is reliable. If the estimated adjusted clock signal is not reliable, the process continues at block 200. If the signal is reliable, the process continues at block 250. If there is no change in temperature, at block 230, the most recent adjustment to the clock signal is used for the estimated adjusted clock signal.

At block 250, it is determined whether the atmospheric pressure sensor data are available in the receiver. If pressure data sensors are available, the change in the pressure from the last moment when the altitude was computed in full GPS solution is used to estimate the change in altitude from that moment at block 260 and the process continues at block 280. If the pressure data are not available, the estimated altitude is assumed unchanged at block 270. At block 280, the estimated adjusted clock signal, estimated altitude, and signals from the two GPS satellites are used to calculate longitude and latitude.

Calculation Accuracy

In one embodiment, a GPS receiver velocity is computed using Equation (7) with an oscillator frequency error determined from its temperature.

The accuracy of the velocity value in Equation (5) is related to the accuracy of Equation (6) that derives oscillator frequency offset from the temperature, T. Ideally, the absolute value of F(T) is very close to the true value, f, for all possible temperature values, T, for each crystal taking into account aging and other factors. In one embodiment, Equation (6) which derives an absolute value of frequency, f, using an absolute value of the measured temperature, T, is replaced by Equation (8) which derives f using relative change in the temperature from its value at the last moment when a full set of the GPS Doppler measurements was available.

$$f(t)=f(t_o)+F(T(t))-F(T(t_o)) \qquad (8)$$

In Equation (8), to is the last time the receiver contacted a full set of GPS satellites to calculate a full solution. As can be seen from Equation (3), when three or more signals from GPS satellites are available, the oscillator frequency offset, f, is accurately derivable from those measurements.

One advantage using equation (8) instead of Equation (6) is that Equation (8) is indifferent to a bias while the same bias would be cause significant error if Equation (6) were used directly. An error in Equation (8) depends on the local gradient of the error in Equation (6). The local gradient error is usually much smaller than the absolute error. This is important when there is a difference in the temperature between the oscillator crystal and a temperature sensor that is used to determine oscillator's temperature T. As a result, a use of Equation (8) enables the use of a much less precise relationship between the oscillator's frequency and its temperature without loss of accuracy over a system using Equation (6).

Figure 3:
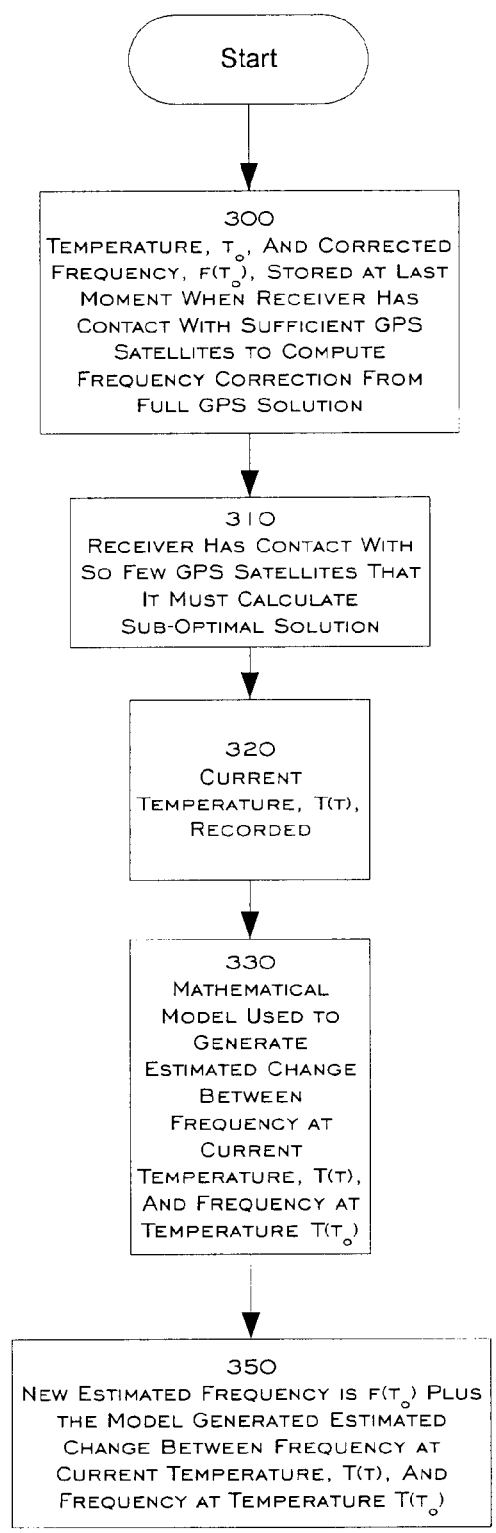
FIG. 3 is a flow diagram of the process of estimating the crystal oscillator frequency in accordance with the present invention.

FIG. 3 illustrates the process of estimating the crystal oscillator frequency in accordance with the present invention. At block 300, the temperature, $T(t_o)$, and corrected frequency, $f(t_o)$, are stored at the last moment when the receiver has contact with sufficient GPS satellites to compute a frequency correction from the full GPS solution. At block 310, the receiver has contact with so few GPS satellites that it must calculate a sub-optimal solution. At block 320, the current temperature, T(t), is recorded. At block 330, a mathematical model is used to generate an estimated change between frequency at the current temperature, T(t), and frequency at the temperature $T(t_o)$. At block 340, the new estimated frequency is $f(t_o)$ plus the model generated estimated change between frequency at the current temperature, T(t), and frequency at the temperature $T(t_o)$.

Mathematical Model

Figure 4:
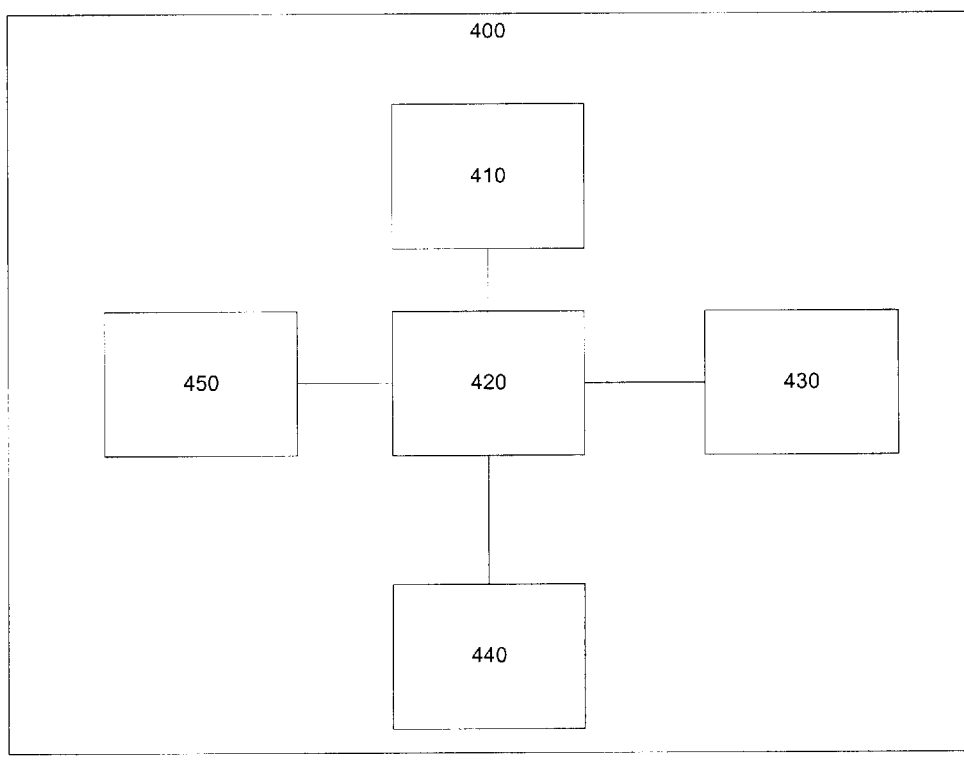
FIG. 4 is a block diagram of a receiver in accordance with one embodiment of the present invention.

In one embodiment of the present invention, a mathematical model of a GPS receiver's clock's response to temperature change is maintained. In one embodiment, the mathematical model is a third order polynomial. FIG. 4 illustrates a receiver in accordance with one embodiment of the present invention. The receiver 400 has a clock 410 coupled to a processor 420. The processor is also coupled to a GPS signal unit 430, a thermometer 440 and a mathematical model unit 450. The processor calculates adjustments to the mathematical model stored in the mathematical model unit using readings from the clock, GPS signal unit, thermometer and mathematical model unit.

In one embodiment, function F(T) is approximated by a curve. The frequency versus temperature relation, F(T), is modeled by an analytical function, the parameters of which are calibrated in the background when the true frequency values computed from the GPS fixes are available.

In one embodiment, a nominal frequency temperature relation is set as a 3d-order polynomial $$F(T)=P_3(T)=f0)+a^* (T-T0)+b^*(T-T0)^2+c^* (T-T0)^3 \qquad (9)$$

Model Calibration

In one embodiment, when a GPS receiver has contact with at least four GPS satellites, the receiver collects data on changes in temperature and resulting changes in the GPS receiver's clock frequency. In one embodiment, temperature data is collected approximately every hundred milliseconds. The data is incorporated into the GPS receiver's mathematical model. In one embodiment, the data is incorporated by means of modifying one or more coefficients in the mathematical model.

Figure 5:
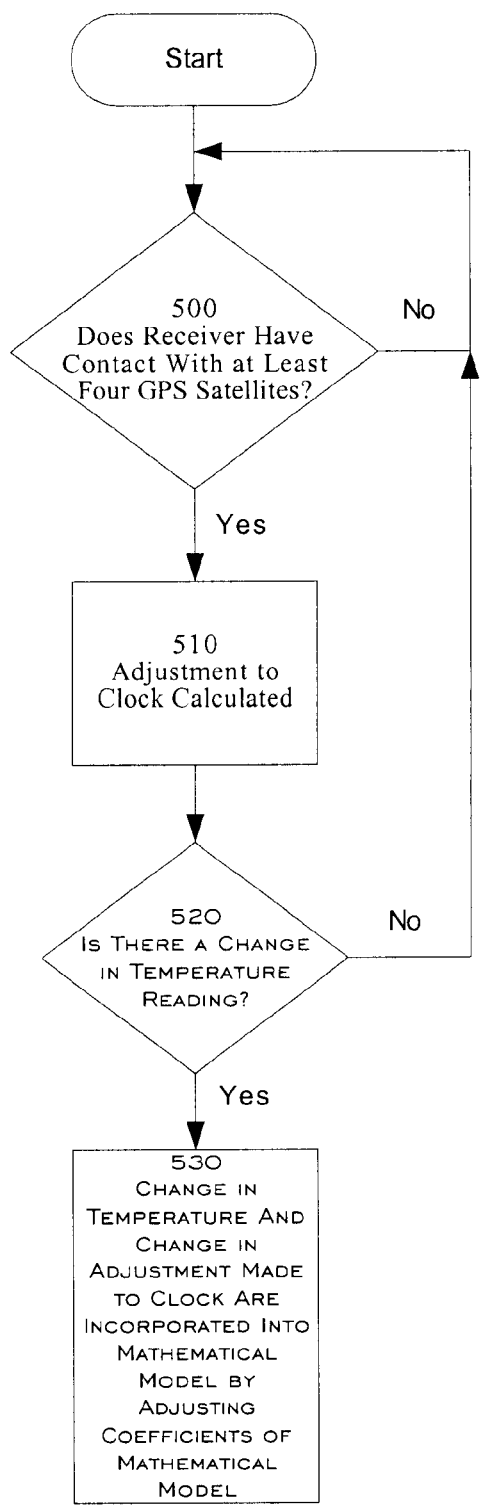
FIG. 5 is a flow diagram of the process of adjusting the mathematical model in accordance with one embodiment of the present invention.

FIG. 5 illustrates the process of adjusting the mathematical model in accordance with one embodiment of the present invention. At block 500, it is determined whether the receiver has contact with at least four GPS satellites. If the receiver does not have contact with at least four GPS satellites, the process repeats at block 500. If the receiver has contact with at least four GPS satellites, at block 510, an adjustment to the clock is calculated.

At block 520, it is determined whether there is a change in the temperature reading. If there is no change in the temperature reading, the process repeats at block 500. If there is a change in the temperature reading, at block 530, the change in temperature and change in the adjustment done to the clock are incorporated into the mathematical model by adjusting the coefficients of the mathematical model.

In Equation (9), T0 is a room temperature. When low cost oscillator crystals are used, this curve is approximately linear in a large range of the operating temperature centered at room temperature. Therefore, an accurate value of the linear coefficient, a, is important. In one embodiment, curve calibration is performed as follows:

Let Tc be the temperature at the time of the first fix, and let fc be the oscillator frequency error computed from the Equation (3) for the first fix. Then, the first estimate of the equation bias, f0, is determined as follows:

$$f0\_est=fc-a^*(Tc-T0)-b^* (Tc-T0)^2-c^*(Tc-T0)^3 \qquad (10)$$

In Equation (10), coefficients a, b and c are set to their nominal values. The nominal values are determined as the average for the XO crystals used in the production. The real values of these coefficients for any particular crystal are unknown and different from their nominal values. Therefore, the initial calibration for the bias coefficient f0 may be different from its true value. However, since the first fix for a newly produced unit is obtained immediately after its production inside a building using a radiation GPS antenna, the temperature, Tc, is close to the nominal room temperature, T0. Therefore, the calibration error (f0_est−f0) which is due to the imperfection of the nominal coefficients a, b, and c, is small as can be seen from the following equation:

$$f0\_est-f0=(Tc-T0)^*(a-an)+(Tc-T0)^{2*} (b-bn)+(Tc-T0)^{3*}(c-cn)$$

Therefore, after the initial calibration the analytical calibration curve becomes $$F(T)=P_3(T)=f0\_est+an^*(T-T0)+bn^* (T-T0)^2+cn^*(T-T0)^3 \qquad (11)$$

In one embodiment, in addition to the nominal temperature frequency relation of Equation (9), a unit maintains a correction table, dF(k), which is filled and used as follows:

A set of temperature values {Tk} is defined. In one embodiment, the set is equally spaced. In another embodiment, the set is not equally spaced. In one embodiment, the dF table is filled with NOVALUE numbers. As a unit performs normal operations, it periodically records difference between the GPS measured frequency, f(T), and the assumed analytical expression, $P_3(T)$, according to Equation (11).

$$df(T)=f(T)-F(T) \quad (12)$$

The value is recorded into cell k of the correction table, dF, if $$T_k-(T_k-T_{k-1})/2<T<T_k+(T_{k+1}-T_k)/2 \quad (13)$$

In one embodiment, the value recorded is selected by the following rule:

$$\text{if } (dF(k)=\text{NOVALUE}) \text{ then } dF(k)=df(T) \text{ else } dF(k)=(1-\alpha)*dF(k)+\alpha*df(T)$$

where $0<\alpha<1$ is a small coefficient.

In one embodiment, the correction table, dF, does not have a constant temperature step. The non-constant temperature step enables fine corrections at the edges of the operation temperature, where frequency changes significantly and nonlinearly with T.

In one embodiment, the table is constantly checked, while it is filled, to detect when there are enough observations to make a reliable correction of the bias, f0, the linear coefficient, a, and, in some instances, quadratic coefficient, b, of the analytical polynomial. The corrections of f0 and the linear coefficient a are made as follows:

$$f0\_est=f0\_est+\text{mean}(dF)$$

$$a=a+\text{sum}\{(dF(k)-\text{mean}(dF))*(Tk-T0)\}/\text{sum}\{(Tk-T0)^2\} \quad (14)$$

After the correction of Equation (14) is performed, the whole correction table, dF, is cleared (all values reset to NOVALUE) and the calibration process repeats itself. In one embodiment, the calibration process is performed constantly, with each calibration serving as a base for the following one. As a result, such temporal changes as aging in the crystal and temperature sensor are accommodated.

Figure 6:
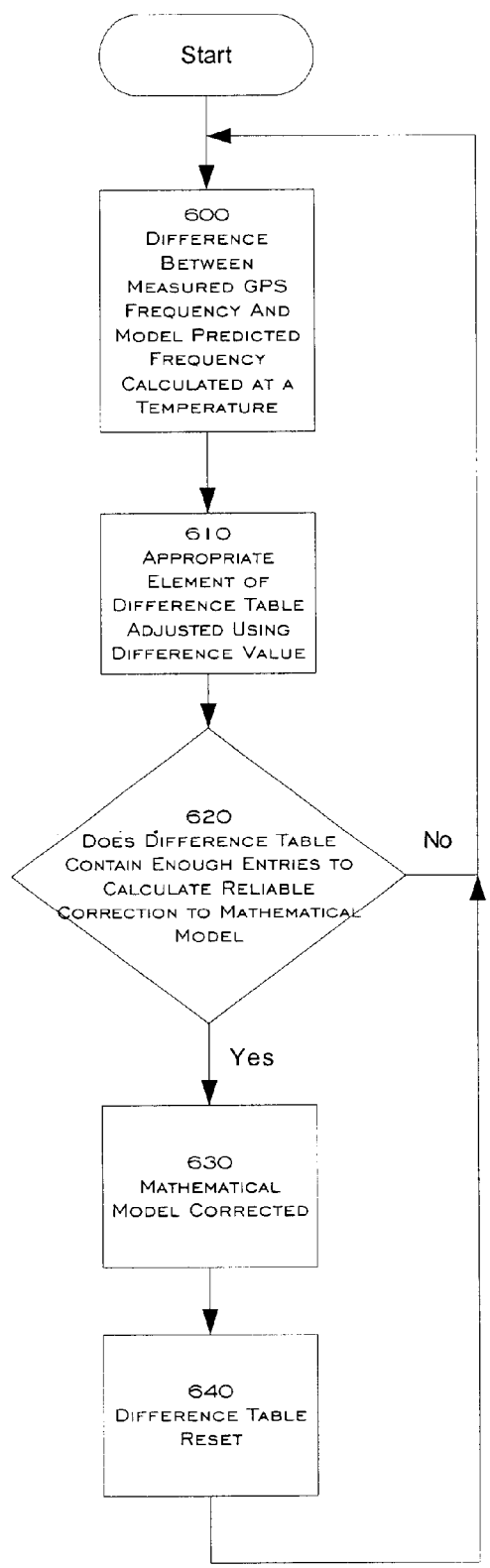
FIG. 6 is a flow diagram of the process of calibrating the mathematical model of frequency vs. temperature when contact is made with sufficient GPS satellites to calculate an full solution in accordance with one embodiment of the present invention.

FIG. 6 illustrates the process of calibrating the mathematical model of frequency vs. temperature when contact is made with sufficient GPS satellites to calculate a full solution in accordance with one embodiment of the present invention. At block 600, a difference between the measured GPS frequency and the model predicted frequency is calculated at a temperature. At block 610, the appropriate element of a difference table is adjusted using the difference value.

At block 620, it is determined whether the difference table contains enough entries to calculate a reliable correction to the mathematical model. If there are not enough entries, the process repeats at block 600. If there are enough entries, at block 630, the mathematical model is corrected. At block 640, the difference table is reset and the process repeats at step 600.

Thus, a method and apparatus for substituting sensor data for a satellite signal in a GPS receiver is described in conjunction with one or more specific embodiments. The invention is defined by the following claims and their full scope and equivalents.

What is claimed is:

1. A method of calculating a GPS solution comprising:

maintaining a mathematical model of a relation between a frequency of a crystal oscillator and a temperature;

generating an estimated frequency value using said mathematical model; and substituting said estimated frequency value for a set of satellite data; wherein said step of generating comprises:

storing a known temperature;

storing a known frequency wherein said known frequency is calculated from a full GPS solution at said known temperature;

calculating a difference between a first value generated by said mathematical model at a current temperature and a second value generated by said mathematical model at said known temperature;

adding said difference to said known frequency.

2. The method of claim 1, wherein said known frequency is the most recent frequency calculated from the full GPS solution.

3. A method of calculating a GPS solution comprising:

maintaining a mathematical model of a relation between a frequency of a crystal oscillator and a temperature;

generating an estimated frequency value using said mathematical model; and substituting said estimated frequency value for a set of satellite data; wherein said model is a third order polynomial.

4. A method of calculating a GPS solution comprising:

maintaining a mathematical model of a relation between a frequency of a crystal oscillator and a temperature;

generating an estimated frequency value using said mathematical model; and substituting said estimated frequency value for a set of satellite data; wherein said step of maintaining comprises:

calculating a difference between a first frequency calculated from the full GPS solution and a second frequency calculated using said mathematical model; and adjusting said mathematical model using said difference.

5. The method of claim 4, wherein said step of maintaining further comprises:

storing said difference in a difference table; and determining whether said difference table contains sufficient entries to reliably calculate an adjustment to the mathematical model.

6. The method of claim 5, wherein said difference table does not have a constant temperature step.

7. The method of claim 4, wherein said step of calculating and said step of adjusting are preformed periodically.

8. The method of claim 4, wherein said step of adjusting adjusts said mathematical model based on a previously performed adjustment.

9. A method of calculating a GPS solution comprising:

maintaining a mathematical model of a relation between a frequency of a crystal oscillator and a temperature;

generating an estimated frequency value using said mathematical model; and substituting said estimated frequency value for a set of satellite data; further comprising:

fixing an altitude value at a last known value.

10. A method of calculating a GPS solution comprising:
maintaining a mathematical model of a relation between a frequency of a crystal oscillator and a temperature;
generating an estimated frequency value using said mathematical model; and
substituting said estimated frequency value for a set of satellite data; further comprising:
determining an altitude value from a sensor data item.

11. The method of claim 10, wherein said step of determining comprises:
calculating a change between said sensor data item and a second sensor data item; and converting said change into an altitude change.

12. A GPS solution calculator comprising:
a mathematical model of a relation between a frequency of a crystal oscillator and a temperature;
a model maintaining unit configured to maintain said mathematical model;
a frequency generator configured to generate an estimated frequency value using said mathematical model; and
a substitution unit configured to substitute said estimated frequency value for a set of satellite data; wherein said frequency generator comprises:
a first storage unit configured to store a known temperature;
a second storage unit configured to store a known frequency wherein said known frequency is calculated at said known temperature;
a calculator configured to calculate a difference between a first value generated by said mathematical model at a current temperature and a second value generated by said mathematical model at said known temperature;
an adding unit configured to add said difference to said known frequency.

13. The GPS solution calculator of claim 12, wherein said known frequency is the most recently calculated frequency from the full GPS solution.

14. A GPS solution calculator comprising:
a mathematical model of a relation between a frequency of a crystal oscillator and a temperature;
a model maintaining unit configured to maintain said mathematical model;
a frequency generator configured to generate an estimated frequency value using said mathematical model; and
a substitution unit configured to substitute said estimated frequency value for a set of satellite data; wherein said model is a third order polynomial.

15. A GPS solution calculator comprising:
a mathematical model of a relation between a frequency of a crystal oscillator and a temperature;
a model maintaining unit configured to maintain said mathematical model;
a frequency generator configured to generate an estimated frequency value using said mathematical model; and
a substitution unit configured to substitute said estimated frequency value for a set of satellite data; wherein said model maintaining unit comprises:
a calculator configured to calculate a difference between a first frequency calculated from the full GPS solution and a second frequency calculated using said mathematical model; and
an adjustment unit configured to adjust said mathematical model using said difference.

16. The GPS solution calculator of claim 15, wherein said model maintaining unit further comprises:
a difference table;
a storage unit configured to store said difference in said difference table; and
a determiner configured to determine whether said difference table contains sufficient entries to reliably calculate an adjustment to the mathematical model.

17. The GPS solution calculator of claim 16, wherein said difference table does not have a constant temperature step.

18. The GPS solution calculator of claim 15, wherein said calculator and said adjustment unit are further configured to operate periodically.

19. The GPS solution calculator of claim 15, wherein said adjustment unit is further configured to adjust said mathematical model based on a previously performed adjustment.

20. A GPS solution calculator comprising:
a mathematical model of a relation between a frequency of a crystal oscillator and a temperature;
a model maintaining unit configured to maintain said mathematical model;
a frequency generator configured to generate an estimated frequency value using said mathematical model; and
a substitution unit configured to substitute said estimated frequency value for a set of satellite data; further comprising:
an altitude determiner configured to fix an altitude value at a last known value.

21. A GPS solution calculator comprising:
a mathematical model of a relation between a frequency of a crystal oscillator and a temperature;
a model maintaining unit configured to maintain said mathematical model;
a frequency generator configured to generate an estimated frequency value using said mathematical model; and
a substitution unit configured to substitute said estimated frequency value for a set of satellite data; further comprising:
an altitude determiner configured to determine an altitude value from a sensor data item.

22. The GPS solution calculator of claim 21, wherein said altitude determiner comprises:
a calculator configured to calculate a change between said sensor data item and a second sensor data item; and
a conversion unit configured to convert said change into an altitude change.

23. A computer program product comprising:
a computer usable medium having computer readable program code embodied therein configured to calculate a GPS solutions said computer program product comprising:
computer readable code configured to cause a computer to maintain a mathematical model of a relation between a frequency of a crystal oscillator and a temperature;
computer readable code configured to cause a computer to generate an estimated frequency value using said mathematical model; and
computer readable code configured to cause a computer to substitute said estimated frequency value for a set of satellite data; wherein said computer readable code configured to cause a computer to generate comprises:
computer readable code configured to cause a computer to store a known temperatures;

computer readable code configured to cause a computer to store a known frequency wherein said known frequency is calculated at said known temperature;

computer readable code configured to cause a computer to calculate a difference between a first value generated by said mathematical model at a current temperature and a second value generated by said mathematical model at said known temperature;

computer readable code configured to cause a computer to add said difference to said known frequency.

24. The computer program product of claim 23, wherein said known frequency is the most recently calculated frequency from the full GPS solution.

25. A computer program product comprising:

a computer usable medium having computer readable program code embodied therein configured to calculate a GPS solution said computer program product comprising:

computer readable code configured to cause a computer to maintain a mathematical model of a relation between a frequency of a crystal oscillator and a temperature;

computer readable code configured to cause a computer to generate an estimated frequency value using said mathematical model; and computer readable code configured to cause a computer to substitute said estimated frequency value for a set of satellite data; wherein said model is a third order polynomial.

26. A computer program product comprising:

a computer usable medium having computer readable program code embodied therein configured to calculate a GPS solution, said computer program product comprising:

computer readable code configured to cause a computer to maintain a mathematical model of a relation between a frequency of a crystal oscillator and a temperature;

computer readable code configured to cause a computer to generate an estimated frequency value using said mathematical model; and computer readable code configured to cause a computer to substitute said estimated frequency value for a set of satellite data; wherein said computer readable code configured to cause a computer to maintain comprises:

computer readable code configured to cause a computer to calculate a difference between a first frequency calculated from the full GPS solution and a second frequency calculated using said mathematical model; and computer readable code configured to cause a computer to adjust said mathematical model using said difference.

27. The computer program product of claim 26, wherein said computer readable code configured to cause a computer to maintain further comprises:

computer readable code configured to cause a computer to store said difference in said difference table; and computer readable code configured to cause a computer to determine whether said difference table contains sufficient entries to reliably calculate an adjustment to the mathematical model.

28. The computer program product of claim 27, wherein said difference table does not have a constant temperature step.

29. The computer program product of claim 26, wherein said computer readable code configured to cause a computer to calculate is further configured to cause a computer to calculate periodically and wherein said computer readable code configured to cause a computer to adjust is further configured to cause a computer to adjust periodically.

30. The computer program product of claim 26, wherein said computer readable code configured to cause a computer to adjust is further configured to cause a computer to adjust said mathematical model based on a previously performed adjustment.

31. A computer program product comprising:

a computer usable medium having computer readable program code embodied therein configured to calculate a GPS solution said computer program product comprising:

computer readable code configured to cause a computer to maintain a mathematical model of a relation between a frequency of a crystal oscillator and a temperature;

computer readable code configured to cause a computer to generate an estimated frequency value using said mathematical model; and computer readable code configured to cause a computer to substitute said estimated frequency value for a set of satellite data; further comprising:

computer readable code configured to cause a computer to fix an, altitude value at a last known value.

32. A computer program product comprising:

a computer usable medium having computer readable program code embodied therein configured to calculate a GPS solution said computer program product comprising:

computer readable code configured to cause a computer to maintain a mathematical model of a relation between a frequency of a crystal oscillator and a temperature;

computer readable code configured to cause a computer to generate an estimated frequency value using said mathematical model; and computer readable code configured to cause a computer to substitute said estimated frequency value for a set of satellite data; further comprising:

computer readable code configured to cause a computer to determine an altitude value from a sensor data item.

33. The computer program product of claim 32, wherein said computer readable code configured to cause a computer to determine comprises:

computer readable code configured to cause a computer to calculate a change between said sensor data item and a second sensor data item; and computer readable code configured to cause a computer to convert said change into an altitude change.

* * * * *